United States Patent [19]

Barton et al.

[11] 4,035,694
[45] July 12, 1977

[54] METAL-CLAD DIELECTRIC SHEETING

[75] Inventors: Robert W. Barton, Cottage Grove; Gaylord L. Groff, North St. Paul, both of Minn.

[73] Assignee: Minnesota Mining and Manufacturing Company, St. Paul, Minn.

[21] Appl. No.: 577,444

[22] Filed: May 14, 1975

Related U.S. Application Data

[63] Continuation-in-part of Ser. No. 431,392, Jan. 7, 1974, abandoned.

[51] Int. Cl.² .......................................... H05K 1/04
[52] U.S. Cl. .......................... 361/400; 428/212; 428/215; 428/288; 428/297; 428/303; 428/474; 428/480; 428/483; 428/901
[58] Field of Search .......... 174/68.5; 428/215, 212, 428/288, 297, 303, 474, 480, 901; 361/400

[56] References Cited

U.S. PATENT DOCUMENTS

| | | | |
|---|---|---|---|
| 3,301,730 | 1/1967 | Spuiak et al. | 156/267 |
| 3,829,354 | 8/1974 | Bertram et al. | 428/272 |
| 3,855,047 | 12/1974 | Groff | 428/290 |
| 3,878,316 | 4/1975 | Groff | 174/68.5 |

Primary Examiner—James J. Bell
Attorney, Agent, or Firm—Cruzan Alexander; Donald M. Sell; Roger R. Tamte

[57] ABSTRACT

Metal-clad dielectric sheeting useful in the manufacture of printed circuitry comprising an electrically conductive metallic layer adhered to a nonwoven web that comprises a unique fiber blend compacted and held together by a polymeric binder material. The fiber blend includes heat-resistant fibers (preferably aromatic polyamide fibers) and high-tensile-strength fibers that absorb little moisture (preferably polyester fibers); and the amount of fibers that absorb moisture is held to a low amount.

16 Claims, 1 Drawing Figure

U.S. Patent    July 12, 1977    4,035,694
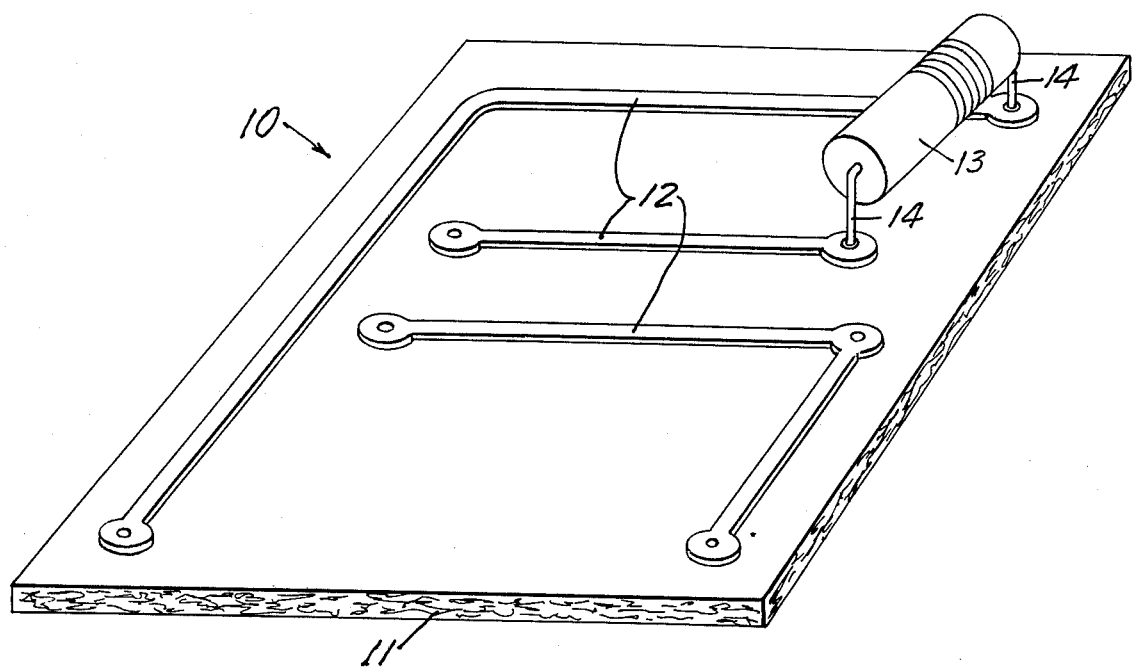

METAL-CLAD DIELECTRIC SHEETING

REFERENCE TO RELATED APPLICATIONS

This application is a continuation-in-part of copending application Ser. No. 431,392, filed Jan. 7, 1974 now abandoned.

BACKGROUND OF THE INVENTION

Some varieties of flexible printed circuitry are prepared by etching selected areas of metal from a metal-clad nonwoven fibrous web. However existing metal-clad nonwoven fibrous webs have been inadequate for use in certain kinds of printed circuitry that require the web to exhibit an extreme degree of dimensional stability during manufacturing and subsequent processing operations of the printed circuitry. For example, to be useful in those kinds of printed circuitry, the nonwoven fibrous web should shrink no more than 10 mils/inch of length during such manufacturing and processing operations, which include etching operations in which metal is removed in areas, and soldering operations in which the printed circuitry is briefly contacted with a molten bath of solder heated to 500° F or more. If the web shrinks more than 10 mils/inch of length, particular sections of the printed circuitry will be out of alignment with electrical components or other circuitry that is to be connected to the printed circuitry. The need for dimensional stability has increased because of an increasing need for larger sheets of printed circuitry, in which changes in dimension accumulate to large overall changes in dimension.

Other necessary properties of the nonwoven fibrous web include good toughness and tear strength (a tear strength of at least 4 pounds (Graves Tear Test as described in ASTM D-1004) or more is desirable); ability to be cut cleanly without formation of projecting fibers; and low capacity for absorbing moisture, which tends to cause blistering of the metal layer away from the nonwoven fibrous web when the metal-clad sheeting is heated on a solder bath.

One existing metal-clad nonwoven fibrous web that generally has quite useful properties for printed circuitry, but which does not always exhibit the extreme degree of dimensional stability described above, is taught in Groff, U.S. Pat. No. 3,878,316. The nonwoven fibrous web that is the backing for that metal-clad product comprises a blend of fibers including heat-softenable fibers that are heat-softened during the process of manufacture of the web to bind the fibers of the nonwoven web into an integral whole (an exemplary fiber blend described in the application comprises 50 weight-percent undrawn heat-softenable polyester fibers, 25 weight-percent drawn polyester fibers, and 25 weight-percent high-temperature resistant aromatic polyamide fibers). Despite the many useful properties of a nonwoven fibrous web as described in that application, such webs have not satisfied the need for webs having the extreme dimensional stability described above. Nor has any other known prior-art nonwoven fibrous web satisfied that need.

SUMMARY OF THE INVENTION

The present invention provides a metal-clad dielectric sheeting that exhibits a desired combination of dimensional stability and other properties that has not previously been available. Briefly, a metal-clad dielectric sheeting of the invention comprises a nonwoven web and an electrically conductive metallic layer adhered to at least one side of the web; said web comprising at least 10 pounds per ream of a fiber blend of discontinuous fibers compacted and held together with a matrix of film-forming high-molecular-weight polymeric binder material that accounts for 5 to 75 weight-percent of the web. Substantially all of the fibers in the fiber blend should generally have a softening point above 450° F. At least 5 weight-percent of the fibers resist distortion when exposed for 10 seconds to a molten solder bath heated to 500° F, at least 30 weight-percent of the fibers exhibit a tensile elongation of at least 20 percent and a tenacity of at least 3.5 grams/denier, and at least 40 weight-percent of the fibers exhibit a moisture regain of less than about 3 weight-percent (which is the amount of weight gain in a previously dried sample when the sample is exposed at 65% relative humidity and 70° F for one day). The polymeric binder material is solid and nontacky at room temperature, at least initially softens and flows slightly under the heat and pressure of the compacting operation, and in film form is foldable upon itself without cracking and resists distortion when heated for 10 seconds on a molten solder bath heated to 500° F. This metal-clad dielectric sheeting generally exhibits no more than a 2 mil/inch change in dimensions upon etch-removal of part of all of the electrically conductive layer, and surprisingly that etch-removal typically results in a small amount of growth (sheeting in which the fibrous web is autogenously bonded with heat-softenable binder fibers typically shrinks upon etch-removal of the electrically conductive metallic layer). Further, sheeting of the invention exhibits less than a 10 mil/inch change in dimension and substantially no blistering upon exposure for 10 seconds to a solder bath heated to 450° F.

DESCRIPTION OF THE DRAWING

The drawing shows a simplified printed circuit 10 made from dielectric sheeting of the invention. As shown, the nonwoven fibrous web or backing 11 carries metal conductors 12 that are left after removal, by etching, of the rest of the metal electrically conductive layer adhered to the web 11. An electrical component 13 is shown electrically connected to conductors 12, as by inserting electric leads 14 from the component through holes punched in the conductors, and then soldering the leads in place.

DETAILED DESCRIPTION

In general, nonwoven webs used in metal-clad dielectric sheeting of the invention are prepared by first blending the desired discontinuous, or staple, fibers; then forming the blend into a fluffy nonwoven web, preferably by conventional air-laying processes such as Rando-webbing or garnetting; then impregnating the web with a polymeric binder material, as by passing the web between two pressure rolls, one of which is partially immersed in a dispersion or solution of the binder material; and finally compacting and drying the web as by passing the impregnated fluffy web between the heated pressure rollers and through an oven (which, in preferred embodiments, also crosslinks the binder material).

The staple fibers used in the fiber blend should have lengths that provide good tear strength and ease of web formation (by "staple" fibers, it is meant discontinuous fibers). Rando-webbing, garnetting or equivalent air-laying processes are generally convenient to use with staple fibers longer than about 0.3 centimeter and preferably longer than 1.5 centimeters. Fibers longer than about 8 or 10 centimeters are generally not used, even on a garnet machine. It is preferred that the discontinuous or staple fibers of the invention be monofilament fibers having filament diameters corresponding to 0.5 to 20 denier, preferably less than 10 denier. The fibers should be included in an amount of at least 10 pounds per ream, and preferably in an amount of 20 pounds per team to provide adequate tear strength to the backing, although the weight will vary somewhat depending on the amount and type of high-strength fiber used.

High-temperature-resistant fibers are important to the dimensional stability of dielectric sheeting of the invention. Temperature resistance can be measured by observing fibers laid on the surface of a molten solder bath heated to 500° F for 10 seconds. Fibers that show a significant distortion (such as polyethylene terephthalate fibers, which curl into a ball in this test) do not have sufficient heat-resistance, and dielectric sheeting made completely from such fibers will not have the needed dimensional stability.

Even a small proportion of high-temperature-resistant fibers, which show little if any distortion in the described solder bath test, will greatly improve the dimensional stability of the dielectric sheeting. Apparently the distribution of high-temperature-resistant fibers through the fiber blend, so that high-temperature-resistant fibers contact the non-high-temperature-resistant fibers, together with the presence of the non-high-temperature-resistant fibers in a matrix of high-temperature-resistant binder material, achieves good dimensional stability. As little high-temperature-resistant fiber as 5 weight-percent of the fiber blend will achieve good dimensional stability, though preferably at least 10 weight-percent high-temperature-resistant fibers are used.

Preferred high-temperature-resistant fibers used in the nonwoven webs of sheeting of the invention are from the class of aromatic polyamides, such as described in Hill et al., U.S. Pat. No. 3,094,511 and Clay, U.S. Pat. No. 3,300,450. Users of printed circuitry of the invention often desire to use temperatures of 600° or 650° F in their molten solder baths, and sheeting based on aromatic polyamides has been found to give the best dimensional stability at such temperatures. These aromatic polyamides have the formula:

$$(-NR_1-Ar_1-NR_1-CO-Ar_2-CO-)_n ,$$

in which $R_1$ is hydrogen or lower alkyl, and $Ar_1$ and $Ar_2$ are divalent aromatic radicals. Among the preferred polymers are those in which $R_1$ is hydrogen and Ar is a meta- or paraphenylene radical. These preferred polymers substantially maintain their physical properties to temperatures about 600° F and do not melt but degrade above about 700° F. The index of polymerization ($n$) should be high enough to provide high molecular weights used in spun filaments. Two especially preferred commercial materials are the "Nomex" and "Kevlar" Brand materials made by duPont, which are believed to principally comprise poly (m-phenylene-isophthalamide) ("Nomex") or poly (p-phenylene-terephthalamide) ("Kevlar"). The latter fibers are especially preferred because they seem to provide better dimensional stability and are less inclined to absorb moisture.

Another useful class of high-temperature-resistant fibers is the class of acrylic fibers, preferably those that are homopolymers of acrylonitrile, but also including copolymers of acrylonitrile (which generally include at least 85 weight-percent percent acrylonitrile) and any additional monomer that does not take away the high-temperature-resistant properties of the fibers. Glass fibers in forms that can be handled on air-laying equipment are another useful high-temperature-resistant fiber.

Preferred tough high-tensile-strength fibers (satisfying the elongation and tenacity requirements stated above) used in sheeting of the invention are polyester fibers of the formula $$(-O-A-O-CO-Ar-CO-)_n$$

where A is a divalent straight-chain or cyclic aliphatic radical, Ar is a divalent aromatic radical, or example, meta- and/or para-phenylene and $n$ is the index of polymerization. These polyesters are prepared in a known manner from difunctional alcohols — for example, ethylene glycol and 1,4-cyclohexanedimethanol —, and difunctional carboxylic acids (or esters thereof) — for example, terephthalic acid, isophthalic acid, and mixtures thereof. For best strength properties, the fibers are drawn, that is, stretched or oriented, causing them to be crystalline in structure.

The aromatic polyamide fibers described above are also often tough, high-strength fibers, as are nylon fibers.

General ranges for the amounts of fibers as listed above in nonwoven webs used in the invention are as follows: for drawn polyester fibers, 30 –95 weight-percent, preferably at least 50 weight-percent, and more preferably at least 70 weight-percent; for aromatic polyamide fibers, 5–60 weight-percent, and preferably 10–30 weight-percent; and for acrylic fibers, up to 70 weight-percent, and preferably up to 40 weight-percent.

The useful binder materials by which nonwoven fibrous webs or backings of the invention are compacted and held together are generally film-forming, high-molecular-weight, high-temperature-resistant (i.e., they resist distortions when exposed for 10 seconds while in film form to a molten solder bath heated to 500° F) materials, and they preferably react to a cross-linked or thermoset condition. They should be solid and non-tacky at room temperature, so that they will hold a fiber blend in a compacted form and so that a compacted web can be laid against another compacted web without tacking the webs together. The useful polymeric binder materials at least initially soften and flow slightly under the heat and pressure of the compacting operation, whereby they fully impregnate the web without flowing freely out of the web; and they retain the web in compacted form immediately after the compacting pressure is released. The polymeric binder materials are also sufficiently flexible so that, when in film form, they can be folded on themselves without cracking. The binder materials should also not absorb undue amounts of moisture, that is, they preferably exhibit a moisture regain of less than about 3 percent when in film form (after crosslinking, if they are reactive).

Particularly useful polymeric binder materials are reactive acrylic-based resins, generally comprising copolymers having a major portion of lower-alkyl (generally one to eight carbon atoms) esters of acrylic or methacrylic acid, such as ethyl acrylate, butyl acrylate and 2-ethyl hexyl acrylate, and a minor portion of acrylic or methacrylic acid. Polyurethane binder materials may also be used. Other useful binder materials are thermoplastic polymers, such as polymers based on vinyl chloride (such as the "Vinyon" brand resins from Union Carbide).

The binder material is generally included in nonwoven fibrous webs in sheeting of the invention in an amount between 5 and 75 weight-percent of the backing, and preferably in an amount less than 35 weight-percent of the backing. Nonwoven fibrous webs useful in the invention are generally rather flexible, as flexible as a 10-mil-thick biaxially oriented polyethylene terephthalate film, for example. The webs are usually less than 20 mils in thickness.

The nonwoven fibrous web or backing is provided with a continuous electrically conductive metallic layer on at least one side, and usually on both sides, preferably by adhering a preformed metal sheet or foil to the web with an adhesive or binder material (which may be the matrix binder material of the web). It is helpful if the web is somewhat porous prior to application of the adhesive material, to provide better anchoring of the adhesive material to the web. A particularly suitable adhesive material is an epoxy-based composition as taught in U.S. Pat. No. 3,027,279. The compositions described in that patent generally comprise a blend of a branched-chain, acid-terminated polyester and an epoxy compound. The polyester is a product of (a) dicarboxylic acid, (b) dihydroxy alcohol, an (c) a polyfunctional compound selected from the class consisting of polyhydric alcohols having at least three nontertiary hydroxyl groups and polybasic acids having at least three carboxyl groups. Not more than one-half of the total of the acids and alcohols contain aromatic rings, and the polyester contains an average of 2.1 to 3.0 carboxyl groups for a molecule; has an acid number of 15 – 125 and a hydroxyl number of less than 10; and is free from ethylenic unsaturation in its skeletal chain. The epoxy compound contains on the average of at least 1.3 groups readily reactive with the carboxyl group, at least one of which groups is the oxirane group; the reactive groups are separated by a chain of at least two carbon atoms, and the chain is free from ethylenic unsaturation.

For example, an epoxy-polyester composition of this type can comprise a blend of (1) a polyester derived from adipic acid, isophthalic acid, propylene glycol and trimethylol propane and (2) a liquid epoxy resin such as the polyglycidyl ether of bisphenol A or resorcinol, the condensation product of 1,1,2,2-tetrakis (4-hydroxyphenyl) ethane and epichlorohydrin, or cyclopentadiene dioxide. Halogenated versions of the described polyesters may be used to provide flame-retardency, and in some cases the halogenated version is applied as a base coat and a non-halogenated version is later applied over the base coat. The adhesive material generally has a solvent-free thickness of 2–5 mils; after solvent-removal metal foil and coated web are assembled and passed through pressure rollers and an oven.

Suitable conductive layers include foils of copper, aluminum, nickel, silver, gold, or suitable transition metals. The thickness of the metal foil is usually on the order of 0.02 to 0.05 millimeter. Conductive layers can also be provided in a laminate of the invention by electroless plating processes. Usually dielectric sheeting of the invention includes an electrically conductive metal layer on both sides of the nonwoven web. Other products include an electrically conductive metal layer on only one side of the web, such products often including a preformed polymeric film on the other side of the web.

The invention will be further illustrated by the following examples:

EXAMPLE 1

The following fiber mixture was opened and blended together on a fiber blender:

|  | Parts by Weight |
|---|---|
| Poly (m-phenyleneisophthalamide) staple fibers, 5.5 denier × 1.5 inches (3.81 cm) ("Nomex" aromatic polyamide fibers from duPont) | 20 |
| Drawn poly (ethylene terephthalate) staple fibers, 6 denier × 1.5 inches (3.81 cm) exhibiting a tensile elongation of about 44 percent and a tenacity of about 4.4 grams/denier ("Celanese Type 400" fibers) | 80 |

The well-blended mixture was then formed into a web on a "Rando-Webber" machine at a speed of about 12 feet per minute (3.6 meters/second). The web, which was fluffy and had a height of about 0.25 inch, was then passed between two vertically aligned squeeze rolls where the polymeric binder material was added. The binder material was a copolymer believed to contain a large proportion of an acrylic or methacrylic ester such as ethyl acrylate and acrylic acid together with a crosslinking agent such as hexamethoxymethyl melamine (Rhoplex AC 172 from Rohm & Haas Co.). This binder material was dispersed in water as an emulsion. The bottom one of the two squeeze rolls was located in a trough containing the emulsion and carried the emulsion to the web; and part of the emulsion was pumped onto the top of the squeeze rolls. The impregnated web traveled through an oven where it was dried at 250° F, and then between rubber and steel rolls heated to 400° F where it was densified to a thickness of about 6 mils. The weight of the resulting porous, dense, tough web was 45 pounds per ream.

The raw web thus produced was then dip-coated with the epoxy-polyester resin of Example 2 of U.S. Pat. No. 3,027,279, that is, the reaction product of (a) an adipic acid/isophthalic acid/propylene glycol trimethylolpropane polyester, (b) an epichlorohydrin-bisphenol A epoxy resin, and (c) tris (2,4,6-dimethylaminomethyl) phenol. The resulting coating had a dry thickness of about 3 mils (0.076 mm) (total on both sides). This coating was dried and B-staged for 20 minutes at 300° F (149° C). One-ounce-per-square-foot (0.03 g/cm$^2$) Treatment A copper sheeting (Circuit Foil Corporation) was then laminated to each side of the web in pressure rolls heated to 280° F (138° C); one roll was steel, and the other was rubber. After laminating, the adhesive was cured 15 minutes at 400° F (205° C). The resulting flat, clad laminate was flexible and had an overall thickness of 10 mils (0.25 mm). The copper was found to be securely bonded to the backing.

The resulting metal-clad dielectric sheeting was then tested for distortion using 3-inch-by-3-inch samples of the sheeting (7.62 centimeters by 7.62 centimeters). One sample was immersed in a solution of ammonium persulfate etchant to remove the copper layers from the sample, and then was dried for 30 minutes at room temperature. This etched sample was then first heated in an oven for 30 minutes at 250° F (121° C) to simulate typical printed-circuit processing steps, and then was immersed for 10 seconds in a bath of tin-lead solder maintained at 500° F. After each of the etching and heating steps, the dimensions of the sample were measured. After etch-removal, it was found that the tested sample had expanded 0.1 percent in length; after the 250° F heating, the sample had shrunk 0.3 percent in length from its original dimensions; and after the 500° F heating step the sample had shrunk 1 percent from its original dimensions.

Another sample of the metal-clad sheeting of this example was tested for solder blistering by first conditioning the sample with controlled humidity conditions (exposure for 24 hours in a chamber heated to 70° F ± 2° F and having a relative humidity of 50% ± 5%) and then immersing the conditioned sample for 10 seconds in a bath of molten tin-lead solder maintained at 450° F or 500° F. Any blistering which occurred would have been caused by escaping moisture, which puffs up or otherwise delaminates the copper, but no blistering was observed.

EXAMPLES 2–4

Additional samples of metal-clad dielectric sheeting were prepared by forming a nonwoven fibrous web or backing from fibers as described in the following tables, using the binder material and procedure described in Example 1 and laminating to that backing a copper foil in the manner described in Example 1. The fiber blends were as follows:

| Example 2 | Parts by Weight |
| --- | --- |
| Poly (acrylonitrile) fibers 3 denier by 1½ inch (Dow-Badische Type 500) | 40 |
| Poly (ethylene terephthalate) fibers as described in Example 1 | 40 |
| Aromatic polyamide fibers as described in Example 1 | 20 |

| Example 3 | Parts by Weight |
| --- | --- |
| Poly (acrylonitrile) fibers as described in Example 2 | 60 |
| Poly (ethylene terephthalate) fibers as described in Example 1 | 40 |

| Example 4 | Parts by Weight |
| --- | --- |
| Poly (ethylene terephthalate) fibers as described in Example 1 | 80 |
| Poly(p-phenyleneterephthalamide) staple fibers ("Kevlar" aromatic polyamide fibers from duPont) | 20 |

When samples were tested as in Example 1, the results were as follows:

| Example Number | After Etching (percent) | Dimensional Change After 250° F Heating for 30 min. (percent) | After 500° F Heating for 10 sec. (percent) | Blistering |
| --- | --- | --- | --- | --- |
| 2 | 0.1 | 0.2 | 0.3 | None |
| 3 | 0.1 | 0.1 | 0.15 | " |
| 4 | 0.1 | 0.1 | 0.1 | " |

EXAMPLES 5 – 8

Example 1 was repeated except for the use of different fiber blends. In each example the fiber blend included 20 weight-percent of 1½ denier by 1½ inches poly(p-phenylene terephthalamide) staple fibers ("Kevlar 29") and 80 weight-percent of 1½ inches staple poly(ethylene terephthalate) fibers having characteristics as follows: Example 5, 6 denier fibers exhibiting a tensile elongation of 34 percent and a tenacity of 4.5 grams/denier (duPont "Type 54"); Example 6, 1½ denier fibers exhibiting a tensile elongation of 44 percent and a tenacity of 4.4 grams/denier ("Celanese Type 400"); Example 7, 1½ denier fibers exhibiting a tensile elongation of 20 percent and a tenacity of 5.8 grams/denier (duPont "Type 106"); and Example 8, 1½ denier fibers exhibiting a tensile elongation of 25% and a tenacity of 5.4 grams/denier ("Celanese Type 310"). Results of tests on metal-clad dielectric sheeting prepared in these examples are as follows (the tests were conducted in sequence, as in Example 1, and the dimensional changes are changes from the original dimensions; the results reported are an average of results on three samples):

| Example Number | Graves Tear (pounds) | | Dimensional Change After Etching at 120° F (mils/inch) | | After Heating for 30 min. at 250° F (mils/inch) | | After Heating for 10 seconds at 500° F (mils/inch) | |
| --- | --- | --- | --- | --- | --- | --- | --- | --- |
| | MD* | CMD** | CD | CMD | CD | CMD | CD | CMD |
| 5 | 6.3 | 6.8 | 1.84 | 1.25 | 2.3 | 1.7 | 1.3 | 0.6 |
| 6 | 6.2 | 6.7 | 1.5 | 1.13 | 1.7 | 1.55 | 0.1 | 0.48 |
| 7 | 5.3 | 5.6 | 0.8 | 0.94 | 0.9 | 0.94 | 5.7 | 3.4 |
| 8 | 6.1 | 5.5 | 1.04 | 0.91 | 1 | 0.9 | 6.1 | 6.2 |

*machine direction
**cross machine direction

What is claimed is:

1. Metal-clad dielectric sheeting useful in the manufacture of printed circuitry comprising a nonwoven web and an electrically conductive metallic layer adhered to at least one side of the web; said web comprising at least 10 pounds per ream of a fiber blend that comprises high-tensile-strength and heat-resistant discontinuous fibers compacted and held together with a matrix of film-forming polymeric binder material that accounts for 5 to 75 weight-percent of the web; substantially all of said fibers having a softening point above 450° F; at least 5 weight-percent of the fibers resisting distortion when exposed for 10 seconds to a molten solder bath heated to 500° F, at least 30 weight-percent of the fibers exhibiting a tensile elongation of at least 20 percent and a tenacity of at least 3.5 grams/denier, and at least 40 weight-percent of the fibers exhibiting a moisture regain of less than about 3 weight-percent; and the polymeric binder material being solid and nontacky at room temperature, at least initially softening and flowing slightly under the heat and pressure of the compacting operation, and in film form being foldable upon itself without cracking and resisting distortion when heated for 10 seconds on a molten solder bath heated to 500°; and the metal-clad dielectric sheeting exhibiting no more than a 2 mil/inch change in dimensions upon etch-removal of part or all of the electrically conductive layer, and exhibiting no more than a 10 mil/inch change in dimensions and substantially no blistering when exposed for 10 seconds to a molten solder bath heated to 450° F.

2. Sheeting of claim 1 in which between 30 and 95 weight-percent of the fiber blend is drawn polyester fibers, between 5 and 60 weight-percent of the fiber blend is aromatic polyamide fibers that resist distortion when exposed for 10 seconds to a molten solder bath heated to 500° F, and up to 70 weight-percent of the fiber blend is acrylic fibers that resist distortion when exposed for 10 seconds to a molten solder bath heated to 500° F.

3. Sheeting of claim 2 in which said aromatic polyamide fibers comprise poly(p-phenylene terephthalamide) fibers.

4. Sheeting of claim 2 in which about 80 weight-percent of the fiber blend is said drawn polyester fibers and about 20 weight-percent of the fiber blend is said aromatic polyamide staple fibers.

5. Sheeting of claim 1 in which said polymeric binder material comprises an acrylic-based binder material.

6. Sheeting of claim 1 in which said polymeric binder material is crosslinked.

7. Sheeting of claim 1 in which the conductive layer comprises copper.

8. Sheeting of claim 1 in which the electrically conductive layer is smaller in area than the nonwoven web.

9. Sheeting of claim 8 in combination with electrical components that are electrically connected to the electrically conductive layer.

10. Metal-clad dielectric sheeting useful in the manufacture of printed circuitry comprising a nonwoven web that is less than about 20 mils in thickness and is at least as flexible as a 10-mil-thick biaxially oriented polyethylene terephthalate film and an electrically conductive metallic layer adhered to at least one side of the web; said web comprising at least 10 pounds per ream of a fiber blend that comprises high-tensile-strength and heat-resistant discontinuous fibers compacted and held together with a matrix of film-forming crosslinked polymeric binder material that accounts for 5 to 75 weight-percent of the web; substantially all of said fibers having a softening point above 450° F; between 30 and 95 weight-percent of the fibers being drawn polyester fibers, between 5 and 60 weight-percent of the fibers being aromatic polyamide staple fibers, and up to 70 weight-percent of the fiber blend being acrylic fibers; both the aromatic and acrylic fibers resisting distortion when exposed for 10 seconds to a molten solder bath heated to 500° F, and the polymeric binder material being solid and nontacky at room temperature, at least initially softening and flowing slightly under the heat and pressure of the compacting operation, and in film form being foldable upon itself without cracking and resisting distortion when heated for 10 seconds on a molten solder bath heated to 500° F; and the metal-clad dielectric sheeting exhibiting no more than a 2 mil/inch change in dimensions upon etch-removal of part or all of the electrically conductive layer, and exhibiting no more than a 10 mil/inch change in dimensions and substantially no blistering when exposed for 10 seconds to a molten solder bath heated to 450° F.

11. Sheeting of claim 10 in which said aromatic polyamide fibers comprise poly (p-phenylene terephthalamide) fibers.

12. Sheeting of claim 10 in which said polymeric binder material comprises an acrylic-based binder material.

13. Sheeting of claim 11 in which the binder material is an acrylic-based material.

14. Sheeting of claim 10 in which about 80 weight-percent of the fiber blend is drawn polyester fibers and about 20 weight-percent of the fiber blend is aromatic polyamide fibers.

15. Sheeting of claim 10 in combination with electrical components that are electrically connected to the electrically conductive layer.

16. A nonwoven web useful as a dielectric backing for flexible printed circuitry comprising a fiber blend that comprises high-tensile-strength and heat-resistant discontinuous staple fibers that substantially all have a softening point above 450° F compacted and held together with a crosslinked film-forming polymeric binder material; the fibers being present in an amount of at least 10 pounds per ream and the binder material being present in an amount of 5 to 75 weight-percent of the web; between 30 and 95 weight-percent of the fiber blend being drawn polyester fibers, between 5 and 60 weight-percent of the fiber blend being aromatic polyamide staple fibers, and up to 70 weight-percent of the fiber blend being acrylic fibers; both the aromatic polyamide and acrylic fibers resisting distortion when exposed for 10 seconds to a molten solder bath heated to 500° F; the polymeric binder material being solid and nontacky at room temperature, at least initially softening and flowing slightly under the heat and pressure of the compacting operation, and in film form being foldable upon itself without cracking and resisting distortion when heated for 10 seconds in a molten solder bath heated to 500° F; and the web upon lamination to an electrically conductive metallic layer forming a metal-clad dielectric sheeting that exhibits less than a 2 mil/inch change in dimensions upon etch-removal of part or all of the electrically conductive layer, and less than a 10 mil/inch change in dimensions and substantially no blistering when exposed for 10 seconds to a molten solder bath heated to 450° F.

* * * * *